US011049857B2

(12) United States Patent
Xiao et al.

(10) Patent No.: US 11,049,857 B2
(45) Date of Patent: Jun. 29, 2021

(54) NANOSHEET CMOS SEMICONDUCTOR DEVICE AND THE METHOD OF MANUFACTURING THE SAME

(71) Applicant: SiEn (QingDao) Integrated Circuits Co., Ltd, Shandong (CN)

(72) Inventors: Deyuan Xiao, Shanghai (CN); Richard R. Chang, Shanghai (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 0 days.

(21) Appl. No.: 16/556,181

(22) Filed: Aug. 29, 2019

(65) Prior Publication Data

US 2020/0075594 A1    Mar. 5, 2020

(30) Foreign Application Priority Data

Sep. 3, 2018   (CN) .......................... 201811021268.8

(51) Int. Cl.
   *H01L 27/092*   (2006.01)
   *H01L 21/8238*   (2006.01)
   (Continued)

(52) U.S. Cl.
   CPC .. *H01L 27/0922* (2013.01); *H01L 21/823807* (2013.01); *H01L 21/823814* (2013.01);
   (Continued)

(58) Field of Classification Search
   CPC ....... H01L 21/8238–823828; H01L 21/82385; H01L 27/092; H01L 27/0922;
   (Continued)

(56) References Cited

U.S. PATENT DOCUMENTS

2011/0248354 A1    10/2011  Xiao et al.
2012/0126197 A1*   5/2012   Chung ................. H01L 27/092
                                                                257/9
(Continued)

OTHER PUBLICATIONS

Taiwanese Office Action, dated Dec. 24, 2019, in a counterpart Taiwanese patent application, No. TW 108114241.

*Primary Examiner* — Zandra V Smith
*Assistant Examiner* — Molly K Reida
(74) *Attorney, Agent, or Firm* — Chen Yoshimura LLP

(57) ABSTRACT

This invention provides a semiconductor device and a manufacturing method thereof. The semiconductor device comprises a subtract; a P-type semiconductor channel and an N-type semiconductor channel, suspended on the subtract; a gate dielectric layer, wrapped around the P-type semiconductor channel and the N-type semiconductor channel; a gate electrode layer, wrapped around the gate dielectric layer; a P-type source region and a P-type drain region, connected to two ends of the P-type semiconductor channel respectively; an N-type source region and an N-type drain region, connected to two ends of the N-type semiconductor channel respectively; wherein the doping concentration at the surface of the P-type semiconductor channel is the highest, then decreases from the surface to the center region, the doping concentration at the surface of the N-type semiconductor channel is the highest, then decreases from the surface to the center region, and a cross-sectional width of the P-type semiconductor channel is greater than that of the N-type semiconductor channel. The present invention has ability to realize multi-layer staking under unit area, and reducing the length of the channel effectively so as to reduce channel effect and improve carrying capacity and integration level of the device.

24 Claims, 6 Drawing Sheets

(51) Int. Cl.
  *H01L 29/06*   (2006.01)
  *H01L 27/12*   (2006.01)
  *H01L 21/84*   (2006.01)
  *H01L 29/10*   (2006.01)

(52) U.S. Cl.
  CPC .... *H01L 21/823821* (2013.01); *H01L 21/845* (2013.01); *H01L 27/0924* (2013.01); *H01L 27/1211* (2013.01); *H01L 29/0673* (2013.01); *H01L 29/105* (2013.01); *H01L 29/1033* (2013.01)

(58) Field of Classification Search
  CPC ............. H01L 27/0924; H01L 29/0673; H01L 29/42392; H01L 29/785; H01L 29/78696; H01L 2029/7858
  See application file for complete search history.

(56) References Cited

U.S. PATENT DOCUMENTS

| | | |
|---|---|---|
| 2013/0078777 A1 | 3/2013 | Cheng et al. |
| 2015/0053912 A1* | 2/2015 | Ching ............. H01L 21/823431 257/9 |

* cited by examiner

NANOSHEET CMOS SEMICONDUCTOR DEVICE AND THE METHOD OF MANUFACTURING THE SAME

CROSS-REFERENCE TO RELATED APPLICATIONS

This application claims priority to P.R.C. Patent Application No. 201811021268.8 titled "semiconductor device and manufacturing method thereof," filed on Sep. 3, 2018, with the State Intellectual Property Office of the People's Republic of China (SIPO).

TECHNICAL FIELD

The present disclosure relates to the design and manufacture of integrated circuits, and particularly, to a three-dimensional stacked gate-all-around nanosheet complementary inverter with junctionless transistors and gradient channel doping profile, and a method for manufacturing the same.

BACKGROUND

With the continuous development of semiconductor technology, the size of semiconductor components is shrunk, the performance of driving current is improved continuously, the power consumption is reduced continuously, and at the same time, more and more serious short-channel effects, increasingly complex semiconductor manufacturing processes and higher production costs are encountered.

Fin field-effect transistor (FinFET) is a new complementary MOS transistor. The shape of the FinFET is similar to that of a fin. This design can improve circuit control, reduce leakage current and shorten the gate length of the transistor FinFET is an innovative design of a transistor-Field Effect Transistor (FET) derived from the traditional standard. In a conventional transistor structure, the gate can only control the on and off of a current in a surface of the channel region, which is a planar structure. In the FinFET architecture, the gate is designed in a fin-shaped 3D architecture that can control the on and off of the circuit on either side of the finned gate. This design can greatly improve circuit control and reduce leakage, and can also significantly shorten the channel length of the transistor.

In early 2011, Intel introduced a commercial FinFET which is used on its 22 nm node process to provide faster and more power saving processors for future mobile processors, etc. In 2015, Samsung took the lead in using FinFET technology for 10 nm process. In 2016, TSMC also used FinFET technology for 10 nm process nodes.

As an improvement of the FinFET technology, the three-sided surrounding gate field effect transistor can effectively improve the power and efficiency of the field effect transistor, which has only recently begun to be used in the fields of server, computers and equipment, such that the three-sided surrounding gate field effect transistor will be the mainstream technology for the next few years.

As the demand for integration level, power, and performance of the device are further improved, power and performance can be further improved by stacking silicon nanosheets together. In U.S. Pat. No. 8,350,298, Xiao Deyuan et al. propose a hybrid crystal orientation accumulation type full-encapsulation gate CMOS field effect transistor, as shown in FIG. 1, which includes: a bottom semiconductor substrate 1010, a PMOS region having a first channel 1301, an NMOS region having a second channel 1301, and a gate region 1500. The cross sections of the first channel 1401 and the second channel 1301 are all racetrack shapes. The gate region 1500 completely wraps the surfaces of the first channel 1401 and the second channel 1301. This device can avoid polycrystalline silicon gate depletion and short channel effects, and increasing the threshold voltage of the device. However, this device has a large limitation on the channel electron mobility, and the device still cannot fully meet the demand for further improvement in power and performance.

Based on the above, it is necessary to provide a semiconductor device structure that can improve the power and performance of the device.

SUMMARY

In light of the abovementioned problems, an object of the present disclosure is to provide a semiconductor device and a manufacturing method thereof, which can solve the problem of low carrier mobility of the device in the prior art.

An objective of the present invention is to provide a semiconductor device. The semiconductor device may comprise a subtract; a P-type semiconductor channel, suspended on the subtract; an N-type semiconductor channel, suspended on the subtract; a gate dielectric layer, wrapped around the P-type semiconductor channel and the N-type semiconductor channel; a gate electrode layer, wrapped around the gate dielectric layer; a P-type source region and a P-type drain region, connected to two ends of the P-type semiconductor channel respectively; and an N-type source region and an N-type drain region, connected to two ends of the N-type semiconductor channel respectively; wherein the doping concentration at the surface of the P-type semiconductor channel is the highest, then decreases from the surface to the center region, the doping concentration at the surface of the N-type semiconductor channel is the highest, then decreases from the surface to the center region, and a cross-sectional width of the P-type semiconductor channel is greater than that of the N-type semiconductor channel.

In accordance with some embodiments, the doping concentration of the P-type semiconductor channel is linear or gradient decreased from the surface towards to the center region, and the doping concentration of the N-type semiconductor channel is linear or gradient decreased from the surface towards to the center region.

In accordance with some embodiments, the doping concentration of the P-type semiconductor channel decreased from the surface towards to the center region is no less than the order of $10^2$, and the doping concentration of the N-type semiconductor channel decreased from the surface towards to the center region is no less than the order of $10^2$.

In accordance with some embodiments, the material of the P-type semiconductor channel comprises P-type ion-doped Si, and the material of the N-type semiconductor channel comprises N-type ion-doped Si.

In accordance with some embodiments, the material of the P-type source region and the P-type drain region comprises the P-type ion-doped SiGe, the material of the N-type source region and the N-type drain region comprises the N-type ion-doped SiC.

In accordance with some embodiments, a cross-sectional width of the P-type source region and the P-type drain region is greater than that of the P-type semiconductor channel, the P-type source region and the P-type drain region are wrapped around the two ends of the P-type semiconductor channel, a cross-sectional width of the N-type source region and the N-type drain region is greater than that of the N-type semiconductor channel, and the N-type source region and the N-type drain region are wrapped around the two ends of the N-type semiconductor channel.

In accordance with some embodiments, the cross-sectional width of the P-type semiconductor channel is 1.5-10 times of that of the N-type semiconductor channel.

In accordance with some embodiments, the cross-sectional width of the P-type semiconductor channel is 2-4 times of that of the N-type semiconductor channel.

In accordance with some embodiments, each of the P-type semiconductor channel and N-type semiconductor channel is rounded to have a cross-sectional shape of a rounded rectangle.

In accordance with some embodiments, the semiconductor device comprises at least two P-type semiconductor channels stacked upward from the substrate and at least two N-type semiconductor channels stacked upward from the substrate, junctionless P-type field effect transistors are formed based on the P-type semiconductor channels, junctionless N-type field effect transistors are formed based on the N-type semiconductor channels, a gap is between two adjacent junctionless P-type field effect transistors and a gap is between two adjacent junctionless N-type field effect transistors, and a gate electrode layer of the junctionless N-type field effect transistors is connected to a gate electrode of the junctionless P-type field effect transistors by a common electrode to form an inverter.

In accordance with some embodiments, the material of the gate electrode layer of the N-type field effect transistors comprises one of TiN, TaN, TiAl, and Ti, and the material of the gate electrode layer of the P-type field effect transistors comprises one of TiN, TaN, TiAl, and Ti, and the material of the common electrode comprises one of Al, W and Cu.

Another objective of the present invention is to provide a manufacturing method of a semiconductor device. The manufacturing method of the semiconductor device includes the steps of: 1) providing a subtract with a P-type semiconductor channel and a N-type semiconductor channel suspended above the subtract, in which a cross-sectional width of the P-type semiconductor channel is greater than that of the N-type semiconductor channel, and the doping concentration at the surface of the P-type semiconductor channel is the highest, then decreases from the surface to the center region, the doping concentration at the surface of the N-type semiconductor channel is the highest, then decreases from the surface to the center region; 2) forming a gate dielectric layer wrapped around the P-type semiconductor channel and the N-type semiconductor channel; 3) forming a gate electrode layer wrapped around the gate dielectric layer; 4) forming a P-type source region and a P-type drain region at the two ends of the P-type semiconductor channel; and forming an N-type source region and an N-type drain region at the two ends of the N-type semiconductor channel.

In accordance with some embodiments, step 1) comprises the steps of: 1-1) providing the substrate with a plurality of substrate structure layers stacked on the substrate, in which the substrate structure layers comprise a sacrificial layer and a channel layer on the sacrificial layer; 1-2) etching the pluralities of substrate structure layers to form a first fin structure and a second fin structure adjacent with each other, in which the first fin structure comprises a plurality of first sacrificial units and a plurality of first semiconductor channels stacked alternatively, the second fin structure comprises a plurality of second sacrificial units and a plurality of plurality of second semiconductor channels stacked alternatively, and a cross-sectional width of the first semiconductor channels is greater than that of the second semiconductor channels; 1-3) selectively removing the first sacrificial units in the first fin structure and the second sacrificial units in the second fin structure to obtain the pluralities of suspended first semiconductor channels and the pluralities of suspended second semiconductor channels; and 1-4) doping P-type ions in the first semiconductor channels to form P-type semiconductor channels, and doping N-type ions in the second semiconductor channels to form N-type semiconductor channels.

In accordance with some embodiments, step 1-4) doping P-type ions in the first semiconductor channels to form P-type semiconductor channels comprises the steps of: a) depositing a heavily boron doped dielectric layer on the surface of the first semiconductor channels; b) performing heat treatment to drive boron dopants in the dielectric layer diffused towards the first semiconductor channels to form the P-type semiconductor channels, wherein the doping concentration of the P-type semiconductor channels decreased from the surface towards to the center region; and c) wet etching to remove the dielectric layer.

In accordance with some embodiments, step 1-4) doping N-type ions in the second semiconductor channels to form N-type semiconductor channels comprises the steps of: a) depositing a heavily phosphorus (P) or arsenic (As) doped dielectric layer on the surface of the second semiconductor channels; b) performing heat treatment to drive phosphorus or arsenic dopants in the dielectric layer diffused towards the second semiconductor channels to form the N-type semiconductor channels, wherein the doping concentration of the N-type semiconductor channels decreased from the surface towards to the center region; and c) wet etching to remove the dielectric layer.

In accordance with some embodiments, the doping concentration of the P-type semiconductor channel is linear or gradient decreased from the surface towards to the center region, and the doping concentration of the N-type semiconductor channel is linear or gradient decreased from the surface towards to the center region.

In accordance with some embodiments, the doping concentration of the P-type semiconductor channel decreased from the surface towards to the center region is no less than the order of $10^2$, and the doping concentration of the N-type semiconductor channel decreased from the surface towards to the center region is no less than the order of $10^2$.

In accordance with some embodiments, the material of the P-type semiconductor channel comprises P-type ion-doped Si, and the material of the N-type semiconductor channel comprises N-type ion-doped Si.

In accordance with some embodiments, the material of the P-type source region and the P-type drain region comprises the P-type ion-doped SiGe, the material of the N-type source region and the N-type drain region comprises the N-type ion-doped SiC.

In accordance with some embodiments, a cross-sectional width of the P-type source region and the P-type drain region is greater than that of the P-type semiconductor channel, the P-type source region and the P-type drain region are wrapped around the two ends of the P-type semiconductor channel, a cross-sectional width of the N-type source region and the N-type drain region is greater than that of the N-type semiconductor channel, and the N-type source region and the N-type drain region are wrapped around the two ends of the N-type semiconductor channel.

In accordance with some embodiments, the cross-sectional width of the P-type semiconductor channel is 1.5-10 times of that of the N-type semiconductor channel.

In accordance with some embodiments, the cross-sectional width of the P-type semiconductor channel is 2-4 times of that of the N-type semiconductor channel.

In accordance with some embodiments, step 1) further comprises a step of rounding the P-type semiconductor channel and the N-type semiconductor channel such that each of the P-type semiconductor channel and the N-type semiconductor channel has a cross-sectional shape of a rounded rectangle.

In accordance with some embodiments, step 1) comprises forming at least two P-type semiconductor channels stacked upward from the substrate and at least two N-type semiconductor channels stacked upward from the substrate, in which a gap is between two adjacent P-type semiconductor channels and a gap is between two adjacent N-type semiconductor channels, the step 4) comprises a step of forming junctionless P-type field effect transistors based on the P-type semiconductor channels, the step 5) comprises a step of forming junctionless N-type field effect transistors based on the N-type semiconductor channels, and further comprising a step of depositing a common electrode after the step 5), in which the common electrode connects a gate electrode layer of the junctionless N-type field effect transistors to a gate electrode of the junctionless P-type field effect transistor to form an inverter.

In accordance with some embodiments, the material of the gate electrode layer of the junctionless N-type field effect transistors comprises one of TiN, TaN, TiAl, and Ti, the material of the gate electrode layer of the junctionless P-type field effect transistors comprises one of TiN, TaN, TiAl, and Ti, and the material of the common electrode comprises one of Al, W and Cu.

As described above, the semiconductor device and the manufacturing method thereof have the following beneficial effects:

At least one of the above and other features and advantages of the present invention may be realized by providing a three-dimensional stacked gate-all-around nanosheet complementary inverter with junctionless transistors and gradient channel doping profile, which can realize multi-layer stack of device under an unit area, reduce the length of the channel of the device, reduce short channel effects, effectively improve the integration level of device, and greatly improve the power of device.

The present invention with a cross-sectional width of the P-type semiconductor channel greater than that of the N-type semiconductor channel has an ability to greatly improve the mobility of holes, improve the current carrying capacity of the P-type field effect transistor, and reduce the resistance and power consumption by increasing the cross-sectional area of the P-type semiconductor channel to increase the migration of the hole. At the same time, the cross-sectional width of the N-type semiconductor channel is designed to be smaller based on the mobility of the electron of the N-type semiconductor channel higher than that of the P-type semiconductor channel, so as to make sure the current carrying capacity of the N-type field effect transistor, reduce the area of the N-type semiconductor channel, reduce the voltage required to turn it off, reduce the total area of components, and improve the integration level of device.

The present invention has an ability to effectively improve the hole mobility of the P-type source region and P-type drain region and improve the electron mobility of the N-type source region and N-type drain region by forming the P-type source region and P-type drain region of the P-type field effect transistor and the N-type source region and N-type drain region of the N-type field effect transistor through epitaxial growth, and using SiGe as material of the substrate of the P-type source region and P-type drain region and using SiC as material of the substrate of the N-type source region and N-type drain region, such that the on-resistance of the inverter can be effectively reduced, and the driving current of the inverter can be improved.

The present invention provides a design of the doping concentration at the surface of both the P-type semiconductor channel and the N-type semiconductor channel are the highest, then decreases gradient from the surface to the center region, which can reduce the hot carrier concentration not controlled by the gate electrode, so as to increase the gate controllability of holes or electrons in the channel, and to increase the device performance.

BRIEF DESCRIPTION OF THE DRAWINGS

Exemplary embodiments will be more readily understood from the following detailed description when read in conjunction with the appended drawings, in which.

DETAILED DESCRIPTION

Figure 1:
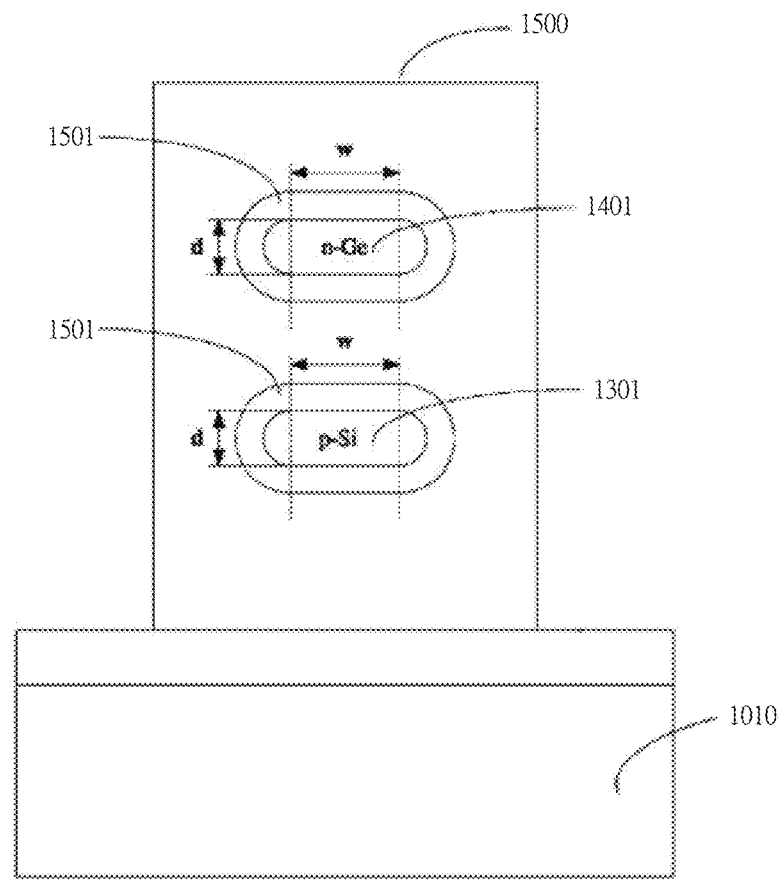
FIG. 1 depicts a schematic view of a mixed crystal orientation accumulation type gate-all-around CMOS field effect transistor in the prior art.

The embodiments of the present invention are described below by way of specific examples, and those skilled in the art can readily understand other advantages and effects of the present invention from the disclosure of the present disclosure. The present invention may be embodied or applied in various other specific embodiments, and various modifications and changes can be made without departing from the spirit and scope of the invention.

Referring to FIGS. 2 through 13. It should be noted that the illustrations provided in this embodiment merely illustrate the basic concept of the present invention in a schematic manner, and only the components related to the present invention are shown in the drawings, instead of the number and shape of components in actual implementation. Dimensional drawing, the actual type of implementation of each component type, number and proportion can be a random change, and its component layout can be more complicated.

Figure 2:
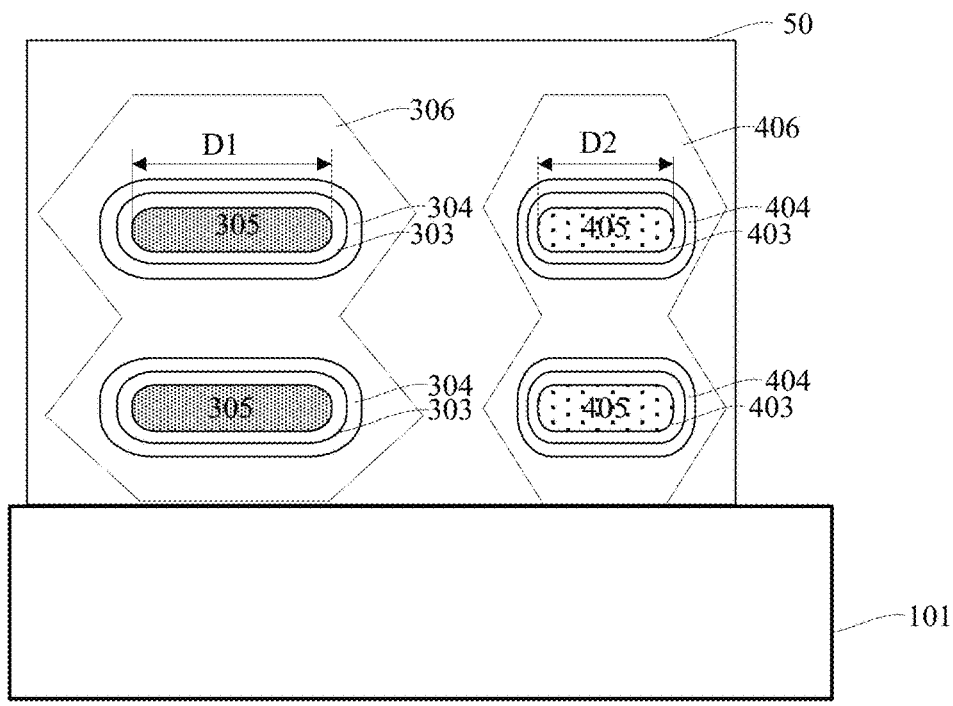
FIG. 2 depicts a schematic view of a three-dimensional stacked gate-all-around nanosheet complementary inverter with junctionless transistors and gradient channel doping profile according to some embodiments of the present disclosure.

As shown in FIG. 2, the present disclosure provides a three-dimensional stacked junctionless semiconductor device, which comprises: a substrate 101, P-type semiconductor channels 305, N-type semiconductor channels 405, gate dielectric layers 303, 403, gate electrode layers 304, 404, a P-type source region and P-type drain region 306, and an N-type source region and an N-type drain region 406.

The substrate 101 may be a silicon (Si) substrate, a silicon carbide (SiC) substrate 101, a silicon germanium (SiGe) substrate 101, etc. In this embodiment, the substrate 101 is a silicon substrate 101, in which an insulator layer 102 is formed on a surface of the silicon substrate 101 to insulate the substrate 101 from a drain region and a sequentially formed common electrode 50 of the device for improving the performance of the device.

As shown in FIG. 2, the P-type semiconductor channels 305 and the N-type semiconductor channels 405 are suspended over the substrate 101. The P-type semiconductor channels 305 and the N-type semiconductor channels 405 can be rounded to have a cross-sectional shape of a rounded rectangle. The material of the P-type semiconductor channels 305 may be P-type ion-doped Si, and the material of the N-type semiconductor channels 405 may be N-type ion-doped Si. In this embodiment, the semiconductor device can include two P-type semiconductor channels 305 stacked upward from the substrate 101 and two N-type semiconductor channels 405 stacked upward from the substrate 101, in which the P-type semiconductor channels 305 can be configured to be P-type field effect transistors, the N-type semiconductor channels 405 can be configured to be N-type field effect transistors, and a cross-sectional width of each of the P-type semiconductor channels 305 may be greater than that of each of the N-type semiconductor channels 405. For example, the cross-sectional width of each of the P-type semiconductor channels 305 may be 1.5-10 times of that of each of the N-type semiconductor channels 405, more preferably, the cross-sectional width of each of the P-type semiconductor channels 305 may be 2-4 times of that of each of the N-type semiconductor channels 405. Since the hole mobility of the P-type semiconductor channels 305 is generally about one third of the electron mobility of the N-type semiconductor channels 405, the cross-sectional width of each of the P-type semiconductor channels 305 designed to be 2-4 times of that of each of the N-type semiconductor channels 405 can effectively improve the load capacity of the P-type field effect transistor while ensuring a small footprint of the P-type field effect transistor. The present invention with the cross-sectional width of the P-type semiconductor channels 305 greater than that of the N-type semiconductor channels 405 has an ability to greatly improve the mobility of holes, improve the current carrying capacity of the P-type field effect transistor, and reduce the resistance and power consumption by increasing the cross-sectional area of the P-type semiconductor channels 305 to increase the migration of the hole. At the same time, the cross-sectional width of the N-type semiconductor channels 405 is designed to be smaller based on the mobility of the electron of the N-type semiconductor channel 405 higher than that of the P-type semiconductor channels 305, so as to make sure the current carrying capacity of the N-type field effect transistor, reduce the area of the N-type semiconductor channels 405, reduce the voltage required to turn it off, reduce the total area of components, and improve the integration level of device.

The doping concentration at the surface of the P-type semiconductor channel 305 is the highest, then decreases from the surface to the center region, the doping concentration at the surface of the N-type semiconductor channel 405 is the highest, then decreases from the surface to the center region, for example, the doping concentration of the P-type semiconductor channel 305 is linear or gradient decreased from the surface towards to the center region, and the doping concentration of the N-type semiconductor channel 405 is linear or gradient decreased from the surface towards to the center region. In accordance with some embodiments, the doping concentration of the P-type semiconductor channel 305 decreased from the surface towards to the center region is no less than the order of $10^2$, and the doping concentration of the N-type semiconductor channel 405 decreased from the surface towards to the center region is no less than the order of $10^2$ in order to obtain the better performance of the present invention. The present invention provides a design of the doping concentration at the surface of both the P-type semiconductor channel and the N-type semiconductor channel are the highest, then decreases gradient from the surface to the center region, which can reduce the hot carrier concentration not controlled by the gate electrode, so as to increase the gate controllability of holes or electrons in the channel, and to increase the device performance.

As shown in FIG. 2, the gate dielectric layers 303, 403 can be wrapped all around t the P-type semiconductor channels 305 and the N-type semiconductor channels 405. The material of the gate dielectric layers 303, 403 can include one of high dielectric constant (k) material, such as silicon dioxide ($SiO_2$), aluminum oxide (AlO), nitride-oxide-silicon ($Si-O_xN_y$) compound, silicon-carbon-oxide (SiOC) compound, hafnium (Hf) base, etc.

The gate electrode layers 304, 404 can be wrapped around the gate dielectric layers 303, 403, in which the gate electrode layers 304, 404 may include gate electrode layers 404 of the N-type field effect transistor and gate electrode layers 304 of the P-type field effect transistor, the gate electrode layers 304 of the P-type field effect transistor may be disposed corresponding to the first semiconductor channels 302, and the gate electrode layers 404 of the N-type field effective transistor may be disposed corresponding to the second semiconductor channels 402.

The material of the gate electrode layers 404 of the N-type field effective transistor may include one of TiN, TaN, TiAl and Ti. The material of the gate electrode layers 304 of the P-type field effect transistor may include one of TiN, TaN, TiAl and Ti. For example, the material of the gate electrode layers 404 of the N-type field effective transistor may be the same with the material of the gate electrode layers 304 of the P-type field effect transistor.

As shown in FIG. 2, the P-type source region and P-type drain region 306 may be connected to the two ends of the P-type semiconductor channels 305. The N-type source region and N-type drain region 406 is connected to the two ends of the N-type semiconductor channels 405. The material of the P-type source region and P-type drain region 306 may include P-type ion-doped SiGe, and the material of the N-type source region and N-type drain region 406 may include N-type ion-doped SiC. The cross-sectional area of the P-type source region and P-type drain region 306 may be greater than the cross-sectional area of the P-type semiconductor channels 305, and the P-type source region and P-type drain region 306 may be wrapped around the two ends of the P-type semiconductor channels 305. The cross-sectional area of the N-type source region and N-type drain region 406 may be greater than the cross-sectional area of the N-type semiconductor channels 405, and the N-type source region and N-type drain region 406 may be wrapped around the two ends of the N-type semiconductor channels 405. The present invention has an ability to effectively improve the hole mobility of the P-type source region and P-type drain region 306 and improve the electron mobility of the N-type source region and N-type drain region 406 by forming the P-type source region and P-type drain region 306 of the P-type field effect transistor and the N-type source region and N-type drain region 406 of the N-type field effect transistor through epitaxial growth, and using SiGe as material of the substrate of the P-type source region and P-type drain region 306 and using SiC as material of the substrate of the N-type source region and N-type drain region 406, such that the on-resistance of the inverter can be effectively reduced, and the driving current of the inverter can be improved.

As shown in FIG. 2, the semiconductor device may include at least two P-type semiconductor channels 305 stacked upward from the substrate and at least two N-type semiconductor channels 405 stacked upward from the substrate 101, in which a junctionless P-type filed effect transistor may be formed based on the P-type semiconductor channels 305 and a junctionless N-type filed effect transistor may be formed based on the N-type semiconductor channels 405. There may be a gap between two adjacent junctionless N-type field effect transistors and a gap between two adjacent junctionless P-type field effect transistors. The gate electrode layer of the junctionless N-type field effect transistor may be connected to the gate electrode of the junctionless P-type field effect transistor by a common electrode 50 to form an inverter, in which the material of the common electrode 50 may include one of Al, W, and Cu.

The present invention provides a three-dimensional stacked gate-all-around nanosheet complementary inverter with junctionless transistors and gradient channel doping profile, which can realize multi-layer stack of device under a unit area, reduce the length of the channel of the device, reduce short channel effects, effectively improve the integration level of device, and greatly improve the power of device.

Figure 3:
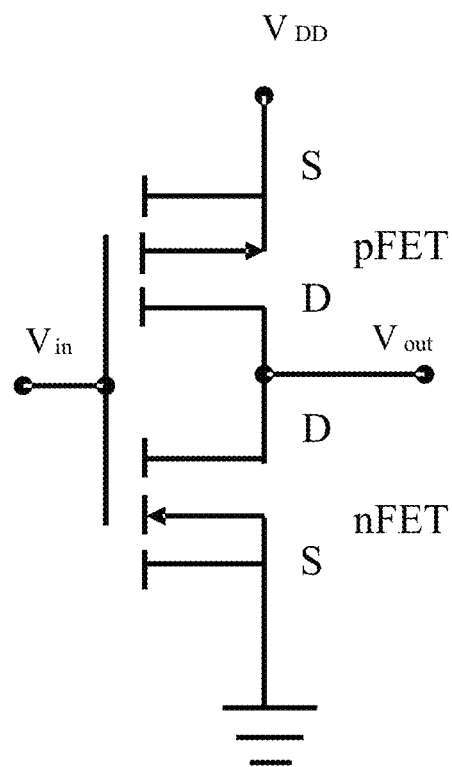
FIG. 3 depicts a schematic circuit diagram of the three-dimensional stacked gate-all-around nanosheet complementary inverter with junctionless transistors and gradient channel doping profile with the N-type field effect transistor connected with the P-type field effect transistor by a common electrode according to some embodiments of the present disclosure.

FIG. 3 depicts a schematic circuit diagram of the N-type field effect transistor connected with the P-type field effect transistor by the common electrode 50 according to some embodiments of the present disclosure. The gate electrode layer 406 of the N-type field effect transistor may be connected with the gate electrode of the P-type field effect transistor as an input terminal Vin. The source of the P-type field effect transistor may be connected with power source VDD. The drain of the N-type field effect transistor may be connected with the drain of the P-type field effect transistor as an output terminal Vout. The source of the N-type field effect transistor may be grounded.

Figure 4:
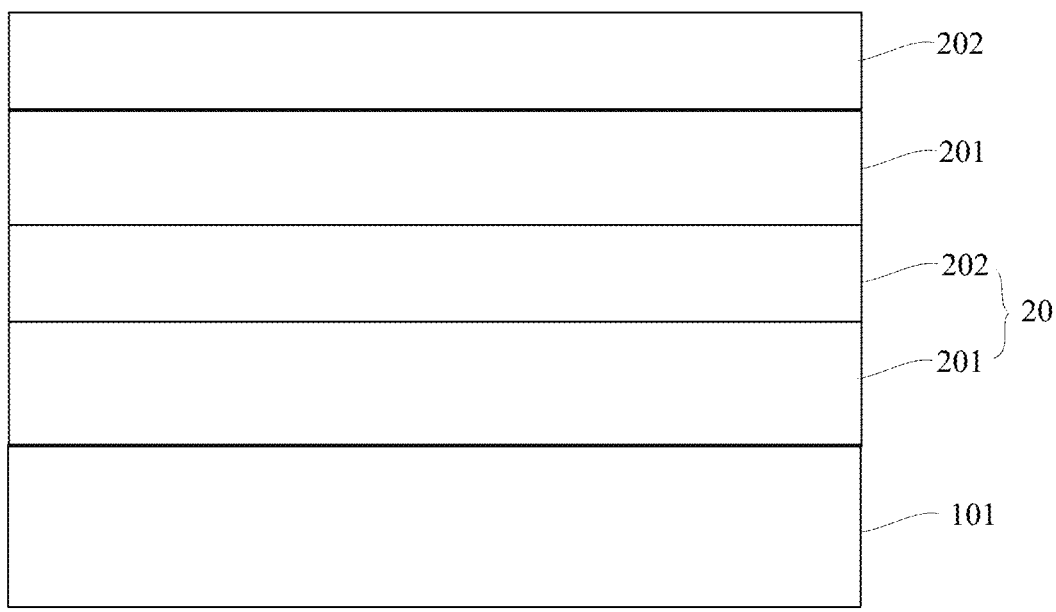
FIGS. 4-13 depict various stages of sequential manufacturing process of the three-dimensional stacked gate-all-around nanosheet complementary inverter with junctionless transistors and gradient channel doping profile according to some embodiments of the present disclosure.

As shown in FIGS. 4 through 13, the present disclosure provides a manufacturing method of a three-dimensional stacked gate-all-around nanosheet complementary inverter with junctionless transistors and gradient channel doping profile. The manufacturing method may include the steps of:

As shown in FIG. 4, step 1) is first performed, a subtract 101 with a plurality of body structure layers 20 stacked above the subtract 101, in which each of the body structure layers 20 may include a sacrifice layer 201 and a channel layer 202 on the sacrifice layer 201.

The substrate 101 may be a Si substrate, a silicon carbide substrate 101, a silicon germanium (SiGe) substrate 101 etc. In this embodiment, the substrate 101 is a silicon substrate 101. Then, the sacrificial layer 201 and the channel layer 202 are repeatedly formed on the substrate 101 by a process such as chemical vapor deposition. The material of the sacrificial layer 201 may be a silicon dioxide, and the material of the channel layer 202 may be silicon.

In this embodiment, the range of the thickness of the sacrificial layer 201 may be between 10~200 nm, such as 50 nm, 100 nm, or 150 nm, and the range of the thickness of the channel layer 202 may be between 10~00 nm, such as 25 nm, 50 nm, or 75 nm.

Figure 5:
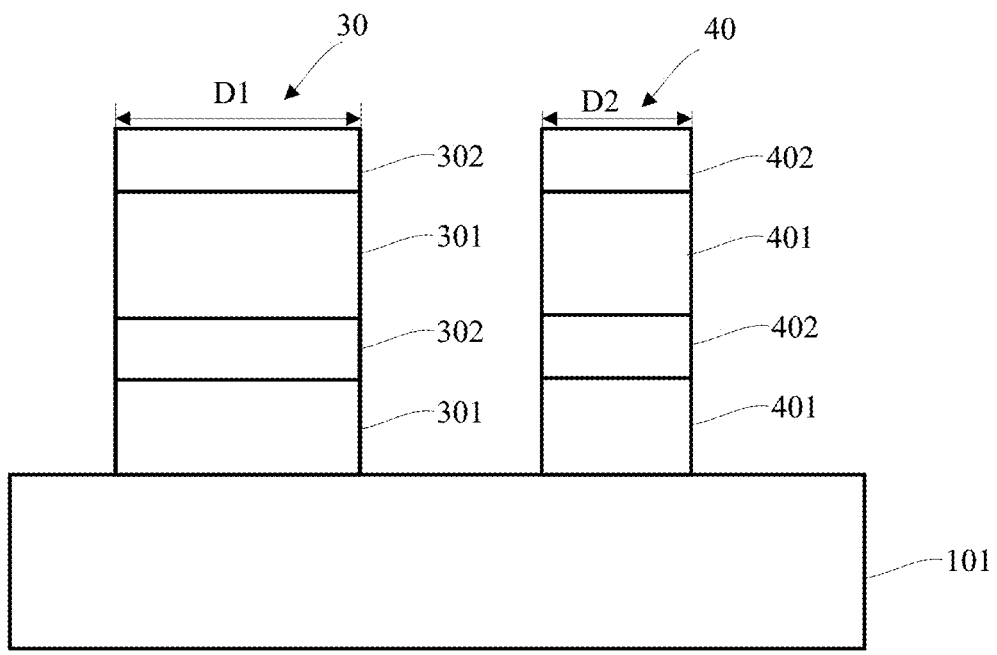

As shown in FIG. 5, step 2) is then performed, the pluralities of body structure layers 20 are etched by a photolithography process and an etching process to form a first fin structure 30 and a second fin structure 40 adjacent with each other on the substrate 101, the width D1 of the first fin structure 30 is greater than that of the width D2 of the second fin structure 40 in which the first fin structure 30 may include a plurality of first sacrificial units 301 and a plurality of first semiconductor channels 302 alternatively stacked, and the second fin structure 40 may include a plurality of second sacrificial units 401 and a plurality of second semiconductor channels 402 alternatively stacked. The first sacrificial units 301 and the second sacrificial units 401 may be formed by etching the sacrificial layer 201, and the first semiconductor channels 302 and the second semiconductor channels 402 may be formed by etching the channel layer 202.

Figure 6:
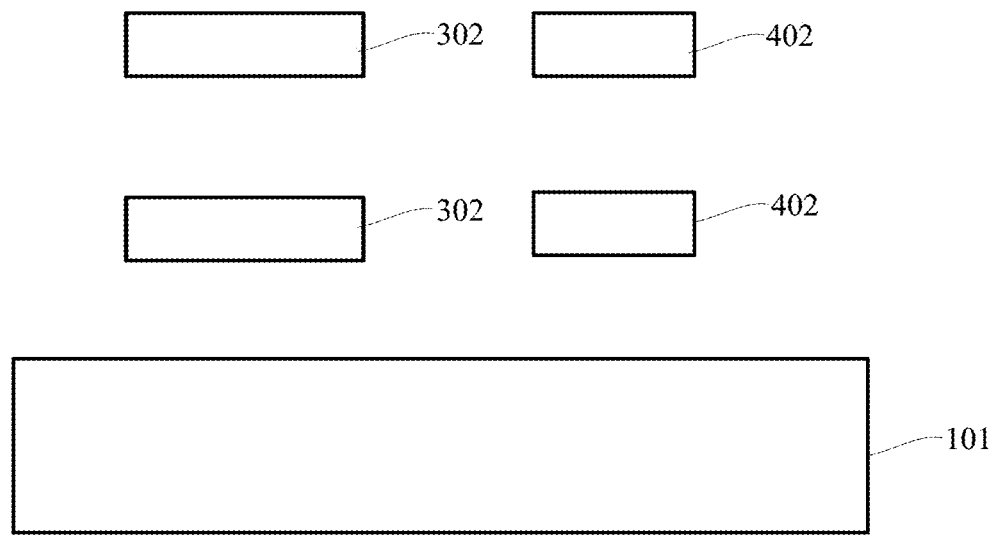

As shown in FIG. 6, step 3) is then performed, the first sacrificial units 301 in the first fin structure 30 and the second sacrificial units 401 in the second fin structure 40 are selectively removed to obtain suspended first semiconductor channels 302 and suspended second semiconductor channels 402.

More specifically, the first sacrificial units 301 in the first fin structure 30 and the second sacrificial units 401 in the second fin structure 40 are wet etched by using a dilute hydrofluoric acid solution DHF to selectively remove the first sacrificial units 301 in the first fin structure 30 and the second sacrificial units 401 in the second fin structure 40 and to obtain the suspended first semiconductor channels 302 and the suspended second semiconductor channels 402.

Figure 7:
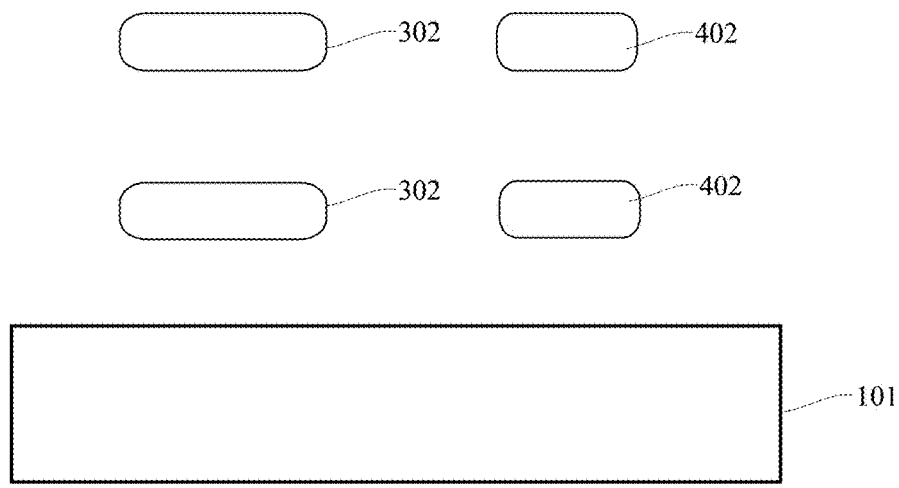
Figure 8:
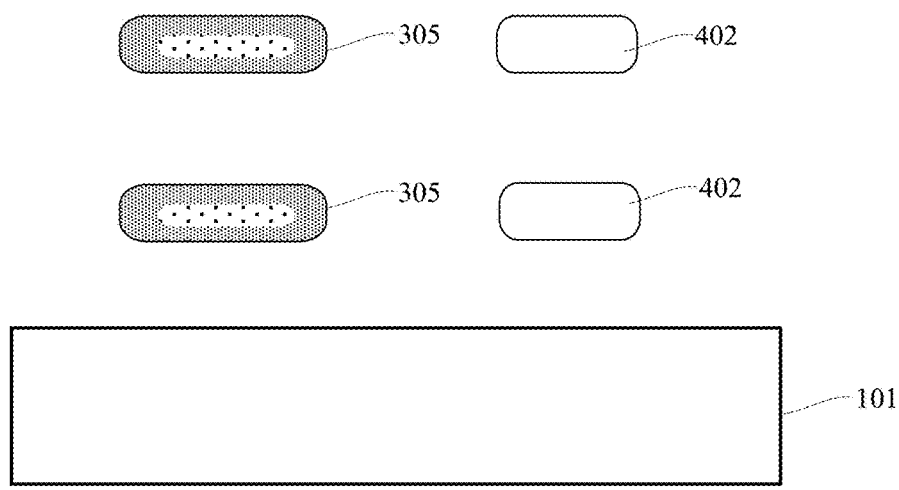
Figure 9:
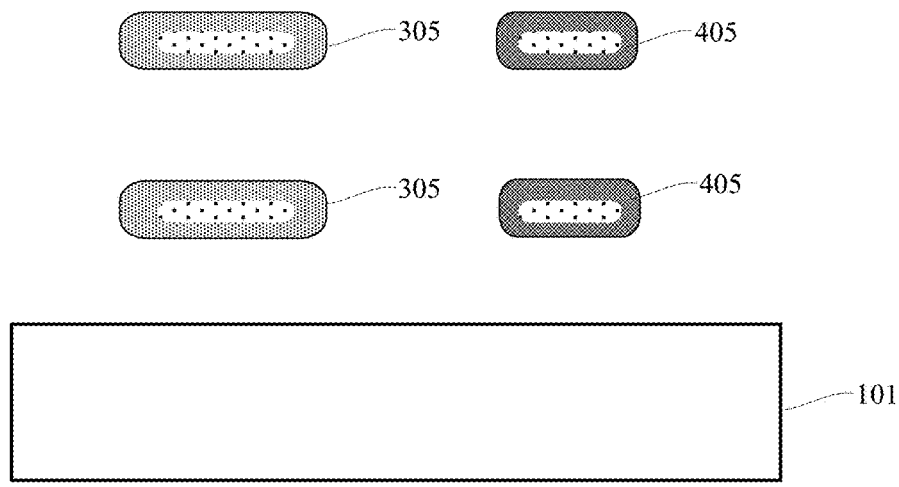

As shown in FIG. 7 through FIG. 9, the semiconductor channels are rounded to have a cross-sectional shape of a rounded rectangle. More specifically, the rounded process may include: a) the first semiconductor channels 302 and the second semiconductor channels 402 may be oxidized by a thermal oxidation process to obtain thermal oxide layers wrapped all around the first semiconductor channels 302 and the second semiconductor channels 402, in which the oxidation temperature of the thermal oxidation process may be between 800° C. and 1200° C., and the oxidation period may be between 5 minutes and 8 hours; b) the thermal oxide layers may be wet etched using a dilute hydrofluoric acid solution DHF to remove it to obtain the first semiconductor channels 302 and the second semiconductor channels 402 having a rounded rectangular (or racetrack shape) cross-sectional shape.

As shown in FIG. 8, P-type ions are doped in the first semiconductor channels to form the P-type semiconductor channels 305. For example, the first semiconductor channels may be doped with the P-type ions to from the P-type semiconductor channels 305 by the following steps:
  a) using a chemical vapor deposition process (CVD) or an atomic layer deposition process (ALD) to deposit a heavily boron doped dielectric layer on the surface of the first semiconductor channels 302, wherein the heavily boron doped dielectric layer can be a heavily boron doped boron-silicate glass;
  b) performing heat treatment to drive the boron dopants in the dielectric layer diffused towards the first semiconductor channels 302 in order to form the P-type semiconductor channels 305, wherein the doping concentration at the surface of the P-type semiconductor channel 305 is the highest, then decreases rom the surface to the center region, and the oxidation temperature of the thermal oxidation process may be between 800° C. and 1200° C., and the oxidation period may be between 5 minutes and 8 hours; preferably, the doping concentration of the P-type semiconductor channel 305 decreased from the surface towards to the center region is no less than in the order of $10^2$ times;

c) using wet etching to remove the dielectric layer, for example the dielectric layer can be removed by using a dilute hydrofluoric acid solution DHF to remove it.

As shown in FIG. 9, N-type ions are doped in the second semiconductor channels to form the N-type semiconductor channels 405. For example, the second semiconductor channels may be doped with the N-type ions to from the N-type semiconductor channels 405 by the following steps:

a) depositing a heavily phosphorus (P) or arsenic (As) doped dielectric layer on the surface of the second semiconductor channels 402, wherein the heavily phosphorus or arsenic doped dielectric layer can be a heavily phosphorus or arsenic doped phosphosilicate glass;

b) performing heat treatment to drive the phosphorus or arsenic dopants in the dielectric layer diffused towards the second semiconductor channels 402 in order to form the N-type semiconductor channels 405, wherein the doping concentration at the surface of the N-type semiconductor channel 405 is the highest, then decreases gradient from the surface to the center region, and the oxidation temperature of the thermal oxidation process may be between 800° C. and 1200° C., and the oxidation period may be between 5 minutes and 8 hours; preferably, the doping concentration of the N-type semiconductor channel 405 decreased from the surface towards to the center region is no less than in the order of $10^2$ times;

c) using wet etching to remove the dielectric layer, for example the dielectric layer can be removed by using a dilute hydrofluoric acid solution DHF to remove it.

The present invention provides a design of the doping concentration at the surface of both the P-type semiconductor channel and the N-type semiconductor channel are the highest, then decreases from the surface to the center region, which can reduce the hot carrier concentration not controlled by the gate electrode, so as to increase the gate controllability of holes or electrons in the channel, and to increase the device performance.

In this embodiment, the semiconductor device can include two P-type semiconductor channels 305 stacked upward from the substrate 101 and two N-type semiconductor channels 405 stacked upward from the substrate 101, in which the P-type semiconductor channels 305 can be configured to be P-type field effect transistors, and the N-type semiconductor channels 405 can be configured to be N-type field effect transistors.

The cross-sectional width of each of the P-type semiconductor channels 305 may be 1.5-10 times of that of each of the N-type semiconductor channels. More preferably, the cross-sectional width of each of the P-type semiconductor channels 305 may be 2-4 times of that of each of the N-type semiconductor channels 405. Since the hole mobility of the P-type semiconductor channels 305 is generally about one third of the electron mobility of the N-type semiconductor channels 405, the cross-sectional width of each of the P-type semiconductor channels 305 designed to be 2-4 times of that of each of the N-type semiconductor channels 405 can effectively improve the load capacity of the P-type field effect transistor while ensuring a small footprint of the P-type field effect transistor.

Figure 10:

As shown in FIG. 10, step 4) is performed, the gate dielectric layers 303, 403 are formed to be wrapped all around the P-type semiconductor channels 305 and the N-type semiconductor channels 405.

For example, the gate dielectric layers 303, 403 wrapped all around the P-type semiconductor channels 305 and the N-type semiconductor channels 405 may be formed by using a chemical vapor deposition process (CVD) or an atomic layer deposition process (ALD), in which the material of the gate dielectric layers 303, 403 may be one of high k material, such as $SiO_2$, AlO, $SiO_xN_y$ compound, SiOC compound, Hf base, etc.

While the gate dielectric layers 303, 403 are formed, an isolation layer 102 may be formed on the surface of the substrate 101 to isolate the substrate 101 from the source region of the device and the subsequently formed common electrode 50, thereby improving the performance of the device.

Figure 11:
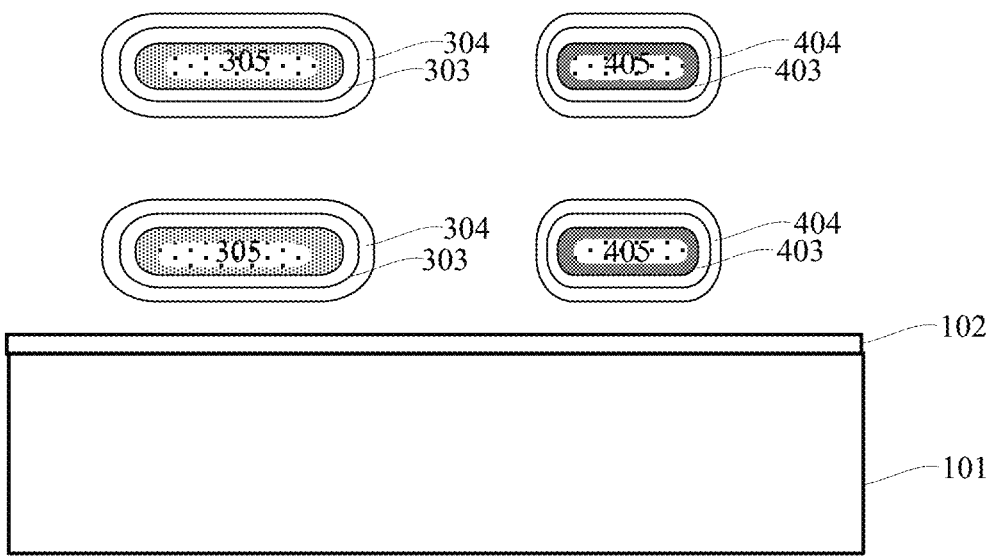

As shown in FIG. 11, step 5) is performed. The gate electrode layers 304, 404 are formed to be wrapped all around the gate dielectric layers 303, 403.

Figure 12:
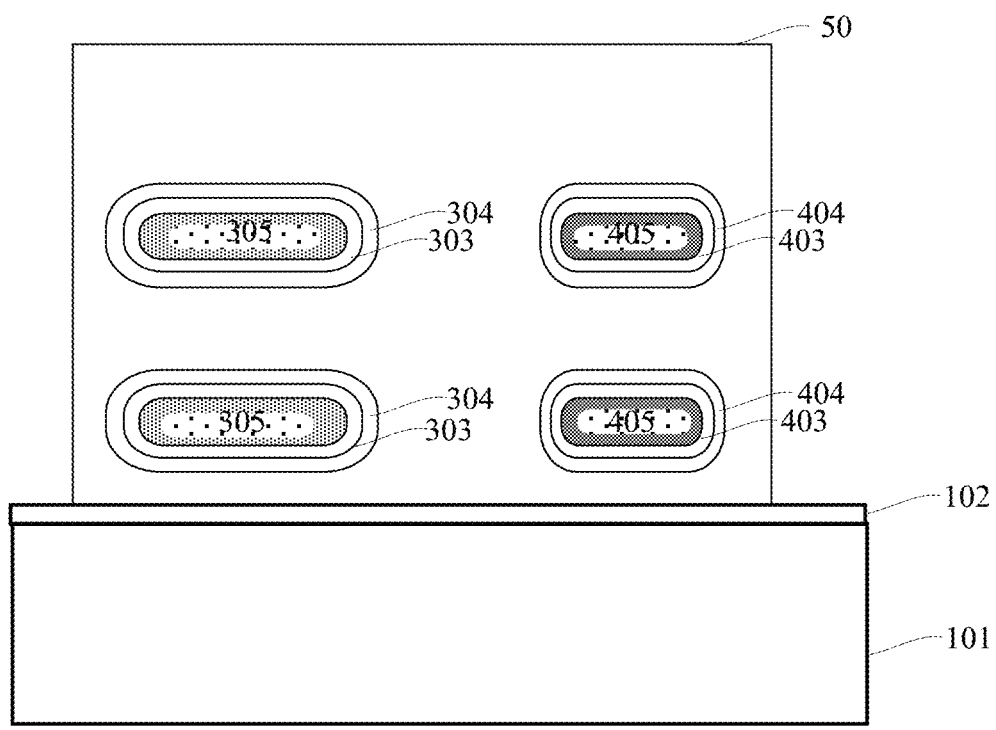

For example, the gate electrode layers 304, 404 wrapped all around the gate dielectric layers 303, 403 may be formed by using a chemical vapor deposition process (CVD) or an atomic layer deposition process (ALD), in which the material of the gate electrode layer 404 of the N-type field transistor may include one of TiN, TaN, TiAl and Ti. The material of the gate electrode layer 304 of the P-type field transistor may include one of TiN, TaN, TiAl and Ti. As shown in FIG. 12, the common electrode 50 may be formed by deposited to be connected to the gate electrode layers 304, 404, in which the material of the common electrode 50 may include one of Al, W, and Cu.

Figure 13:
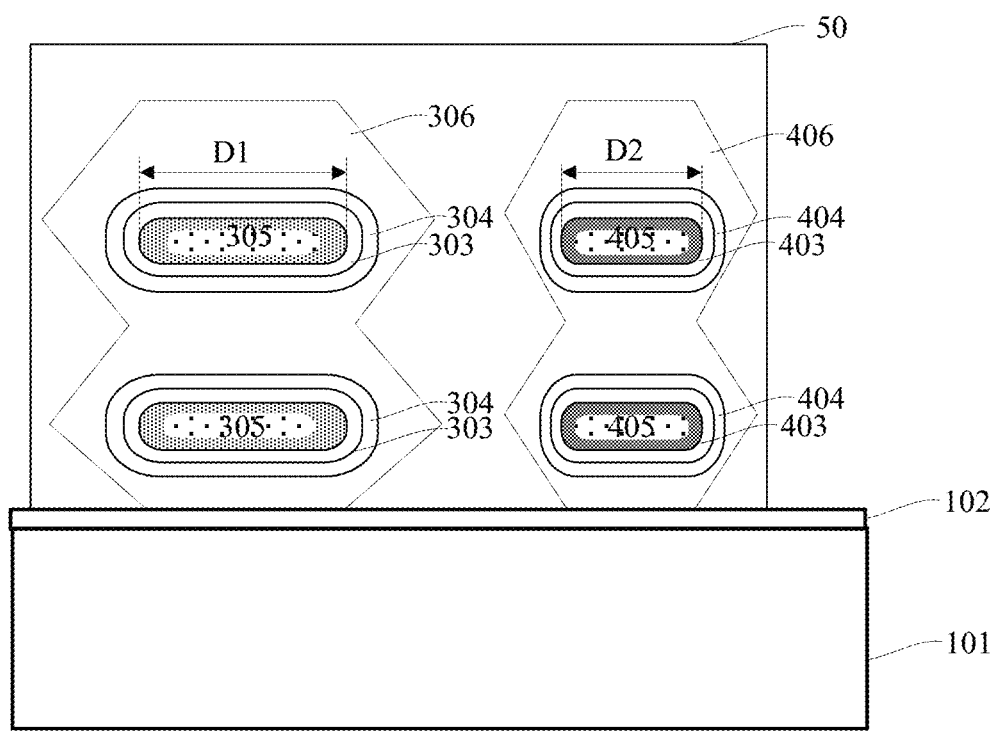

As shown in FIG. 13, step 6) is performed. The P-type source region and P-type drain region 306 may be formed on the two ends of the P-type semiconductor channels 305 to form the junctionless P-type field effect transistor. The N-type source region and N-type drain region 406 may be formed on the two ends of the N-type semiconductor channels 405 to form the junctionless N-type field effect transistor. The gate electrode layers 404 of the junctionless N-type field effect transistor may be connected to the gate electrode layers 304 of the junctionless P-type field effect transistor by the common electrode 50 to form the inverter.

The material of the P-type source region and P-type drain region 306 may comprise the P-type ion-doped SiGe, the material of the N-type source region and the N-type drain region 406 may comprise the N-type ion-doped SiC. The cross-sectional area of the P-type source region and P-type drain region 306 may be greater than the cross-sectional area of the P-type semiconductor channels 305, and the P-type source region and P-type drain region 306 may be wrapped around the two ends of the P-type semiconductor channels 305. The cross-sectional area of the N-type source region and N-type drain region 406 may be greater than the cross-sectional area of the N-type semiconductor channels 405, and the N-type source region and N-type drain region 406 may be wrapped around the two ends of the N-type semiconductor channels 405.

The material of the P-type source region and P-type drain region 306 may include P-type ion-doped SiGe, and the material of the N-type source region and N-type drain region 406 may include N-type ion-doped SiC. The cross-sectional area of the P-type source region and P-type drain region 306 may be greater than the cross-sectional area of the P-type semiconductor channels 305, and the P-type source region and P-type drain region 306 may be wrapped around the two ends of the P-type semiconductor channels 305. The cross-sectional area of the N-type source region and N-type drain region 406 may be greater than the cross-sectional area of the N-type semiconductor channels 405, and the N-type source region and N-type drain region 406 may be wrapped around the two ends of the N-type semiconductor channels 405.

The present invention has an ability to effectively improve the hole mobility of the P-type source region and P-type drain region 306 and improve the electron mobility of the N-type source region and N-type drain region 406 by forming the P-type source region and P-type drain region 306 of the P-type field effect transistor and the N-type source region and N-type drain region 406 of the N-type field effect transistor through epitaxial growth, and using SiGe as material of the substrate of the P-type source region and P-type drain region 306 and using SiC as material of the substrate of the N-type source region and N-type drain region 406, such that the on-resistance of the inverter can be effectively reduced, and the driving current of the inverter can be improved.

As described above, the semiconductor device and the manufacturing method thereof have the following beneficial effects:

At least one of the above and other features and advantages of the present invention may be realized by providing a three-dimensional stacked gate-all-around nanosheet complementary inverter with junctionless transistors and gradient channel doping profile, which can realize multi-layer stack of device under a unit area, reduce the length of the channel of the device, reduce short channel effects, effectively improve the integration level of device, and greatly improve the power of device.

The present invention with a cross-sectional width of the P-type semiconductor channel greater than that of the N-type semiconductor channel has an ability to greatly improve the mobility of holes, improve the current carrying capacity of the P-type field effect transistor, and reduce the resistance and power consumption by increasing the cross-sectional area of the P-type semiconductor channel to increase the migration of the hole. At the same time, the cross-sectional width of the N-type semiconductor channel is designed to be smaller based on the mobility of the electron of the N-type semiconductor channel higher than that of the P-type semiconductor channel, so as to make sure the current carrying capacity of the N-type field effect transistor, reduce the area of the N-type semiconductor channel, reduce the voltage required to turn it off, reduce the total area of components, and improve the integration level of device.

The present invention has an ability to effectively improve the hole mobility of the P-type source region and P-type drain region and improve the electron mobility of the N-type source region and N-type drain region by forming the P-type source region and P-type drain region of the P-type field effect transistor and the N-type source region and N-type drain region of the N-type field effect transistor through epitaxial growth, and using SiGe as material of the substrate of the P-type source region and P-type drain region and using SiC as material of the substrate of the N-type source region and N-type drain region, such that the on-resistance of the inverter can be effectively reduced, and the driving current of the inverter can be improved.

The present invention provides a design of the doping concentration at the surface of both the P-type semiconductor channel and the N-type semiconductor channel are the highest, then decreases gradient from the surface to the center region, which can reduce the hot carrier concentration not controlled by the gate electrode, so as to increase the gate controllability of holes or electrons in the channel, and to increase the device performance.

Therefore, the present invention effectively overcomes various shortcomings in the prior art and has high industrial utilization value.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantage.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:
1. A semiconductor device, comprising:
a subtract;
a P-type semiconductor channel, suspended on the subtract;
an N-type semiconductor channel, suspended on the subtract;
a gate dielectric layer, wrapped around the P-type semiconductor channel and the N-type semiconductor channel;
a gate electrode layer, wrapped around the gate dielectric layer;
a P-type source region and a P-type drain region, connected to two ends of the P-type semiconductor channel respectively; and
an N-type source region and an N-type drain region, connected to two ends of the N-type semiconductor channel respectively;
wherein the doping concentration at the surface of the P-type semiconductor channel is the highest, then decreases from the surface to the center region, the doping concentration at the surface of the N-type semiconductor channel is the highest, then decreases from the surface to the center region, and a cross-sectional width of the P-type semiconductor channel is greater than that of the N-type semiconductor channel.

2. The semiconductor device according to claim 1, wherein the doping concentration of the P-type semiconductor channel is linear or gradient decreased from the surface towards to the center region, and the doping concentration of the N-type semiconductor channel is linear or gradient decreased from the surface towards to the center region.

3. The semiconductor device according to claim 1, wherein the doping concentration of the P-type semiconductor channel decreased from the surface towards to the center region is no less than the order of $10^2$, and the doping concentration of the N-type semiconductor channel decreased from the surface towards to the center region is no less than the order of $10^2$.

4. The semiconductor device according to claim 1, wherein the material of the P-type semiconductor channel comprises P-type ion-doped Si, and the material of the N-type semiconductor channel comprises N-type ion-doped Si.

5. The semiconductor device according to claim 1, wherein the material of the P-type source region and the P-type drain region comprises the P-type ion-doped SiGe, the material of the N-type source region and the N-type drain region comprises the N-type ion-doped SiC.

6. The semiconductor device according to claim 1, wherein a cross-sectional width of the P-type source region and the P-type drain region is greater than that of the P-type semiconductor channel, the P-type source region and the P-type drain region are wrapped around the two ends of the P-type semiconductor channel, a cross-sectional width of the N-type source region and the N-type drain region is greater than that of the N-type semiconductor channel, and the N-type source region and the N-type drain region are wrapped around the two ends of the N-type semiconductor channel.

7. The semiconductor device according to claim 1, wherein the cross-sectional width of the P-type semiconductor channel is 1.5-10 times of that of the N-type semiconductor channel.

8. The semiconductor device according to claim 7, wherein the cross-sectional width of the P-type semiconductor channel is 2-4 times of that of the N-type semiconductor channel.

9. The semiconductor device according to claim 1, wherein each of the P-type semiconductor channel and N-type semiconductor channel is rounded to have a cross-sectional shape of a rounded rectangle.

10. The semiconductor device according to claim 1, wherein the semiconductor device comprises at least two P-type semiconductor channels stacked upward from the substrate and at least two N-type semiconductor channels stacked upward from the substrate, junctionless P-type field effect transistors are formed based on the P-type semiconductor channels, junctionless N-type field effect transistors are formed based on the N-type semiconductor channels, a gap is between two adjacent junctionless P-type field effect transistors and a gap is between two adjacent junctionless N-type field effect transistors, and a gate electrode layer of the junctionless N-type field effect transistors is connected to a gate electrode of the junctionless P-type field effect transistors by a common electrode to form an inverter.

11. The semiconductor device according to claim 10, wherein the material of the gate electrode layer of the N-type field effect transistors comprises one of TiN, TaN, TiAl, and Ti, and the material of the gate electrode layer of the P-type field effect transistors comprises one of TiN, TaN, TiAl, and Ti, and the material of the common electrode comprises one of Al, W and Cu.

12. A manufacturing method of a semiconductor device, comprising the steps of:
1) providing a subtract with a P-type semiconductor channel and an N-type semiconductor channel suspended above the subtract, in which a cross-sectional width of the P-type semiconductor channel is greater than that of the N-type semiconductor channel, and the doping concentration at the surface of the P-type semiconductor channel is the highest, then decreases from the surface to the center region, the doping concentration at the surface of the N-type semiconductor channel is the highest, then decreases from the surface to the center region;
2) forming a gate dielectric layer wrapped around the P-type semiconductor channel and the N-type semiconductor channel;
3) forming a gate electrode layer wrapped around the gate dielectric layer;
4) forming a P-type source region and a P-type drain region at the two ends of the P-type semiconductor channel; and
5) forming an N-type source region and an N-type drain region at the two ends of the N-type semiconductor channel.

13. The manufacturing method according to claim 12, wherein the step 1) comprises steps of:
1-1) providing the substrate with a plurality of substrate structure layers stacked on the substrate, in which the substrate structure layers comprise a sacrificial layer and a channel layer on the sacrificial layer;
1-2) etching the pluralities of substrate structure layers to form a first fin structure and a second fin structure adjacent with each other, in which the first fin structure comprises a plurality of first sacrificial units and a plurality of first semiconductor channels stacked alternatively, the second fin structure comprises a plurality of second sacrificial units and a plurality of a plurality of second semiconductor channels stacked alternatively, and a cross-sectional width of the first semiconductor channels is greater than that of the second semiconductor channels;
1-3) selectively removing the first sacrificial units in the first fin structure and the second sacrificial units in the second fin structure to obtain the pluralities of suspended first semiconductor channels and the pluralities of suspended second semiconductor channels; and
1-4) doping P-type ions in the first semiconductor channels to form P-type semiconductor channels, and doping N-type ions in the second semiconductor channels to form N-type semiconductor channels.

14. The manufacturing method according to claim 13, wherein the step 1-4) doping P-type ions in the first semiconductor channels to form P-type semiconductor channels comprises the steps of:
a) depositing a heavily boron doped dielectric layer on the surface of the first semiconductor channels;
b) performing heat treatment to drive boron dopants in the dielectric layer diffused towards the first semiconductor channels to form the P-type semiconductor channels, wherein the doping concentration of the P-type semiconductor channels decreased from the surface towards to the center region; and
c) wet etching to remove the dielectric layer.

15. The manufacturing method according to claim 13, wherein the step 1-4) doping N-type ions in the first semiconductor channels to form N-type semiconductor channels comprises the steps of:
  a) depositing a heavily phosphorus (P) or arsenic (As) doped dielectric layer on the surface of the second semiconductor channels;
  b) performing heat treatment to drive phosphorus or arsenic dopants in the dielectric layer diffused towards the second semiconductor channels to form the N- type semiconductor channels, wherein the doping concentration of the N-type semiconductor channels decreased from the surface towards to the center region; and
  c) wet etching to remove the dielectric layer.

16. The manufacturing method according to claim 12, wherein the doping concentration of the P-type semiconductor channel decreased from the surface towards to the center region is no less than the order of $10^2$, and the doping concentration of the N-type semiconductor channel decreased from the surface towards to the center region is no less than the order of $10^2$.

17. The manufacturing method according to claim 12, wherein the material of the P-type semiconductor channel comprises P-type ion-doped Si, and the material of the N-type semiconductor channel comprises N-type ion-doped Si.

18. The manufacturing method according to claim 12, wherein the material of the P-type source region and the P-type drain region comprises the P-type ion-doped SiGe, the material of the N-type source region and the N-type drain region comprises the N-type ion-doped SiC.

19. The manufacturing method according to claim 12, wherein a cross-sectional width of the P-type source region and the P-type drain region is greater than that of the P-type semiconductor channel, the P-type source region and the P-type drain region are wrapped around the two ends of the P-type semiconductor channel, a cross-sectional width of the N-type source region and the N-type drain region is greater than that of the N-type semiconductor channel, and the N-type source region and the N-type drain region are wrapped around the two ends of the N-type semiconductor channel.

20. The manufacturing method according to claim 19, wherein the cross-sectional width of the P-type semiconductor channel is 1.5-10 times of that of the N-type semiconductor channel.

21. The manufacturing method according to claim 20, wherein the cross-sectional width of the P-type semiconductor channel is 2-4 times of that of the N-type semiconductor channel.

22. The manufacturing method according to claim 12, wherein the step 1) further comprising a step of rounding the P-type semiconductor channel and the N-type semiconductor channel such that each of the P-type semiconductor channel and the N-type semiconductor channel has a cross-sectional shape of a rounded rectangle.

23. The manufacturing method according to claim 12, wherein the step 1) comprises forming at least two P-type semiconductor channels stacked upward from the substrate and at least two N-type semiconductor channels stacked upward from the substrate, in which a gap is between two adjacent P-type semiconductor channels and a gap is between two adjacent N-type semiconductor channels, the step 4) comprises a step of forming junctionless P-type field effect transistors based on the P-type semiconductor channels, the step 5) comprises a step of forming junctionless N-type field effect transistors based on the N-type semiconductor channels, and further comprising a step of depositing a common electrode after the step 5), in which the common electrode connects a gate electrode layer of the junctionless N-type field effect transistors to a gate electrode of the junctionless P-type field effect transistor to form an inverter.

24. The manufacturing method according to claim 23, wherein the material of the gate electrode layer of the junctionless N-type field effect transistors comprises one of TiN, TaN, TiAl, and Ti, the material of the gate electrode layer of the junctionless P-type field effect transistors comprises one of TiN, TaN, TiAl, and Ti, and the material of the common electrode comprises one of Al, W and Cu.

* * * * *